United States Patent [19]
Kan et al.

[11] Patent Number: 5,345,100
[45] Date of Patent: Sep. 6, 1994

[54] SEMICONDUCTOR RECTIFIER HAVING HIGH BREAKDOWN VOLTAGE AND HIGH SPEED OPERATION

[75] Inventors: Takashi Kan; Masaru Wakatabe; Mitsugu Tanaka; Shinji Kunori; Akira Sugiyama, all of Saitama, Japan

[73] Assignee: Shindengen Electric Manufacturing Co., Ltd., Tokyo, Japan

[21] Appl. No.: 119,561

[22] Filed: Sep. 13, 1993

Related U.S. Application Data

[63] Continuation of Ser. No. 857,999, Mar. 26, 1992, abandoned.

[30] Foreign Application Priority Data

Mar. 29, 1991 [JP]  Japan .................................. 3-133737
Mar. 29, 1991 [JP]  Japan .................................. 3-133738

[51] Int. Cl.$^5$ ...................... H01L 29/78; H01L 23/00
[52] U.S. Cl. ..................................... 257/475; 257/487; 257/109
[58] Field of Search .......................... 257/109, 487, 475

[56] References Cited

U.S. PATENT DOCUMENTS

| | | | |
|---|---|---|---|
| 3,849,789 | 11/1974 | Cordes et al. | 257/475 |
| 4,641,174 | 2/1987 | Baliga | 257/475 |
| 5,101,244 | 3/1992 | Mori et al. | 257/475 |

FOREIGN PATENT DOCUMENTS

| | | | |
|---|---|---|---|
| 59-35183 | 8/1984 | Japan | 257/475 |
| 2-151067 | 6/1990 | Japan | 257/475 |
| 3-105975 | 5/1991 | Japan | 257/475 |

Primary Examiner—Ngan V. Ngo
Assistant Examiner—Stephen D. Meier
Attorney, Agent, or Firm—Finnegan, Henderson, Farabow, Garrett & Dunner

[57] ABSTRACT

A semiconductor rectifier having a high breakdown voltage and a high speed operation is provided, which comprises a semiconductor substrate including a first semiconductor layer of one conductivity type and a second semiconductor layer of one conductivity type provided on the first semiconductor layer, a third semiconductor layer of an opposite conductivity type having a depth D and formed in the second semiconductor layer to provide a pn junction therebetween, the third semiconductor layer defining a plurality of exposed regions of the second semiconductor layer, each of the plurality of exposed regions of the second semiconductor layer having a width W, a relation between the depth D and the width W being given by $D \geq 0.5W$, and a metal electrode provided on the substrate surface.

19 Claims, 9 Drawing Sheets

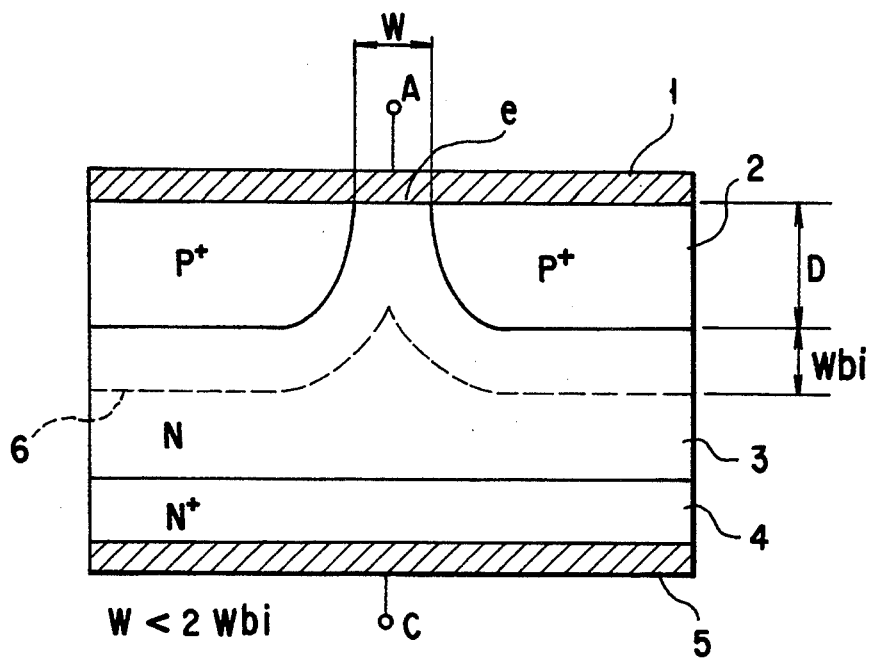
F I G. 2A

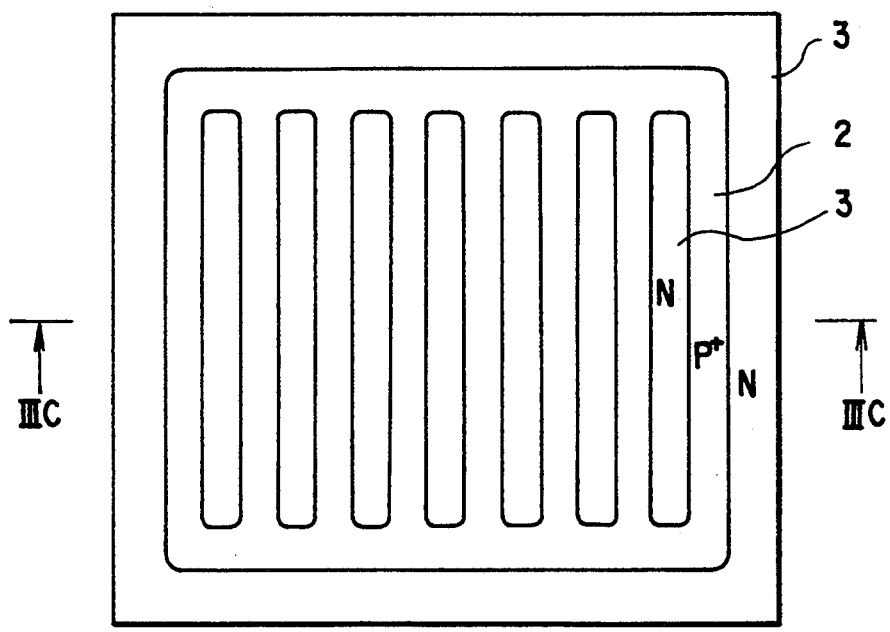
F I G. 3B
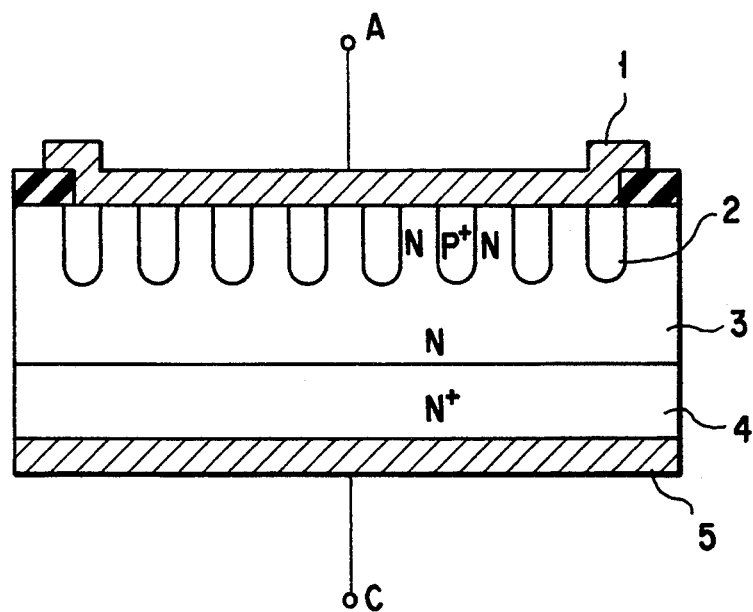
F I G. 3C

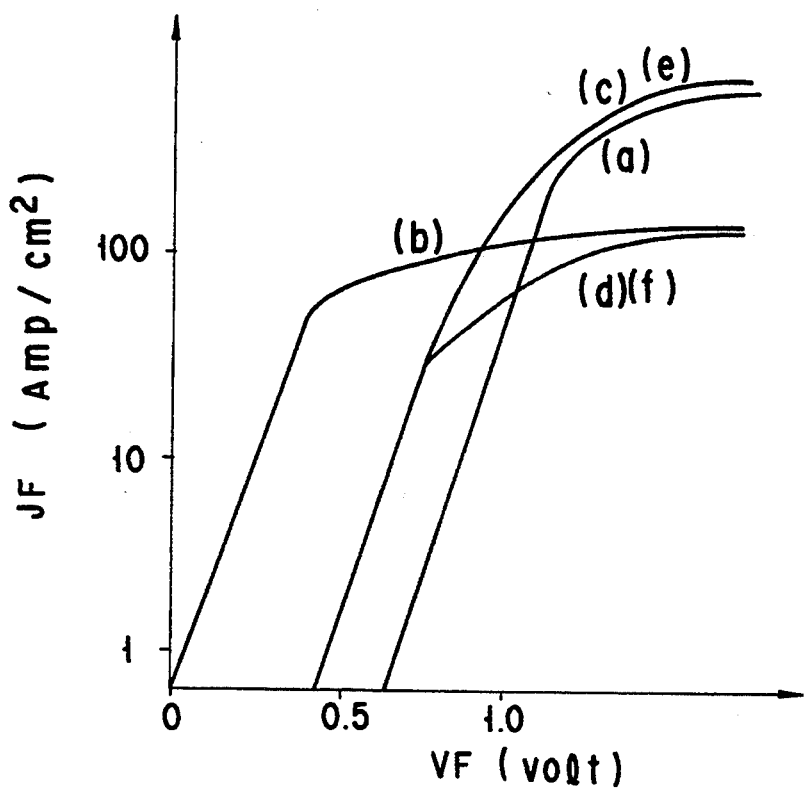
F I G. 4
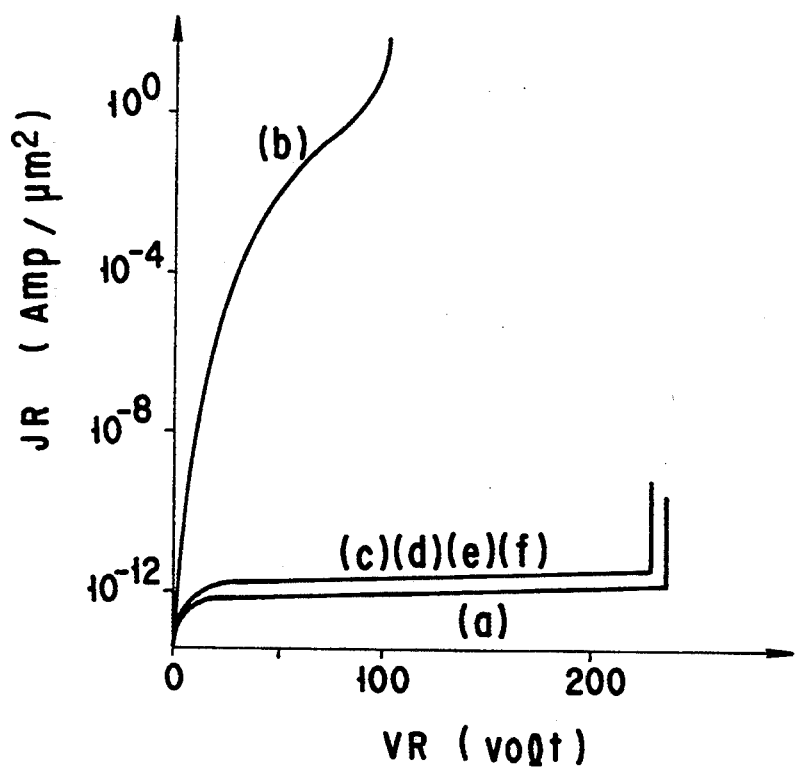
F I G. 5

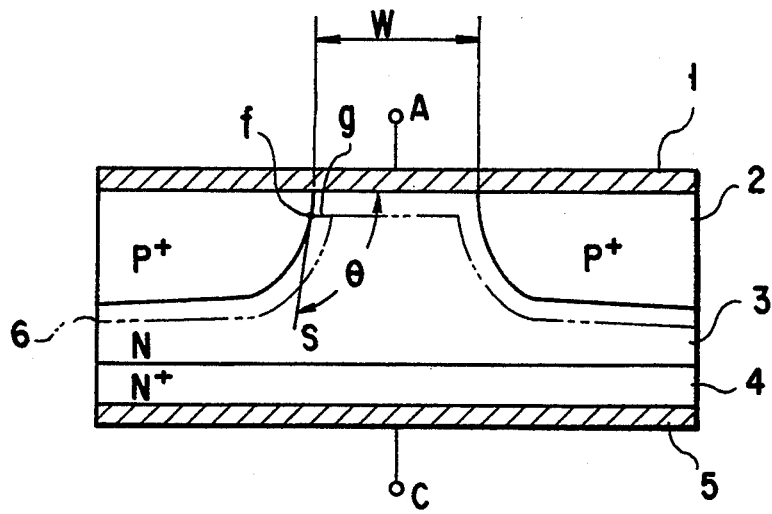
F I G. 9C
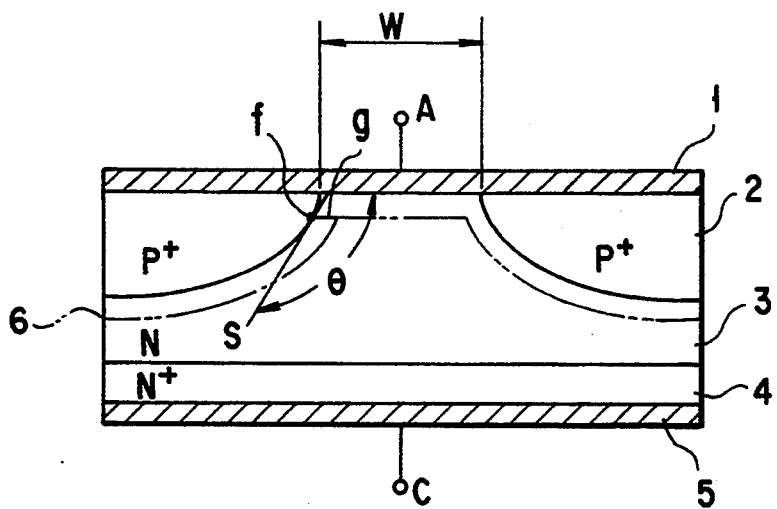
F I G. 9D

5,345,100

SEMICONDUCTOR RECTIFIER HAVING HIGH BREAKDOWN VOLTAGE AND HIGH SPEED OPERATION

This application is a continuation of application Ser. No. 07/857,999, filed Mar. 26, 1992, now abandoned.

BACKGROUND OF THE INVENTION

Field of the Invention

This invention relates to a semiconductor device, and more particularly to a semiconductor rectifier having a high breakdown voltage and a high speed operation.

Description of the Related Art

As is well known in the art, it has been desired to improve characteristics of semiconductor devices such as rectifiers, and particularly to improve the switching speed and the forward and reverse characteristics. Therefore, various semiconductor devices have been proposed.

FIG. 1 shows a structure of a rectifier having a normal PN junction. 1 denotes an ohmic metal electrode, 2 a P+-type semiconductor layer, 3 an N-type semiconductor layer, 4 an N+-type semiconductor layer, and 5 an ohmic metal electrode, respectively. A and C indicate an anode and a cathode, respectively.

In general, the forward characteristic of the rectifier shown in FIG. 1 exhibits a curve (a) in a $V_F$-$J_F$ (forward voltage drop-forward current) characteristic of FIG. 4, and the reverse characteristic exhibits a curve (a) in a $V_R$-$J_R$ (reverse voltage-reverse leakage current) characteristic of FIG. 5.

When a voltage is applied to the rectifier so as to change the forward direction to the reverse direction, a long time of more than several hundred nanoseconds is required as a time (reverse recovery time trr) for completely recovering the PN junction to the reverse direction characteristic, because a large number of holes with a low mobility injected into the N-type semiconductor layer 3 remain therein. Therefore, such a rectifier is not suitable for a high speed circuit.

In order to eliminate the above problem, various structures have been proposed.

For example, a heavy metal such as gold, platinum, etc, is diffused into the rectifier of FIG. 1 whereby the minority carrier (holes) disappear.

According to the structure using the heavy metal diffusion, trr can be reduced to approx. 1/10 of the inherent value. However the reverse leakage current and the forward voltage drop may be increased as compared with the normal PN junction rectifier thereby to increase the loss.

Further, a rectifier having a Schottky barrier contact has been proposed as a rectifier for attaining high speed operation. The forward characteristic of the rectifier is shown by a curve (b) in the $V_F$-$J_F$ characteristic of FIG. 4, and the reverse characteristic of the rectifier is shown by a curve (b) in the $V_R$-$J_R$ characteristic of FIG. 5. That is, the switching speed and the forward voltage drop can be improved as compared with the normal PN junction rectifier. However, as is clearly understood by comparing the curves (a) and (b) of FIG. 5, the reverse leakage current and breakdown voltage cannot be improved.

For eliminating disadvantages of the Schottky barrier type rectifier, Japanese Patent Publication No. 59-35183 Japanese Patent Disclosure No. 2-151067 and U.S. Pat. No. 4,641,174 have been proposed. However, these documents do not disclose a device for suppressing the reverse leakage current and attaining the high speed operation.

SUMMARY OF THE INVENTION

Accordingly, an object of the present invention is to provide a semiconductor rectifier having a high breakdown voltage and a high speed operation.

Another object of the present invention is to provide a semiconductor rectifier having a low forward voltage drop and a small reverse leakage current.

Still another object of the present invention is to provide a semiconductor rectifier having a short reverse recovery time.

According to one aspect of this invention, there is provided a semiconductor rectifier, which comprises a semiconductor substrate including a first semiconductor layer of one conductivity type and a second semiconductor layer of one conductivity type provided on the first semiconductor layer, a third semiconductor layer of an opposite conductivity type having a depth D and formed in the second semiconductor layer to provide a pn junction therebetween, the third semiconductor layer defining a plurality of exposed regions of the second semiconductor layer, each of the plurality of exposed regions of the second semiconductor layer having a width W, a relation between the depth D and the width W being given by $D \geq 0.5W$, and a metal electrode provided on the substrate surface.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 2A is a cross sectional view showing a unit cell of a rectifier ($W < 2W_{bi}$) according to a first embodiment of the invention;

FIG. 3B is a plan view of the rectifier having a plurality of unit cells each having the same structure as the unit cell of FIG. 2A or 2B;

FIG. 3C is a cross sectional view taken along the IIIC—IIIC line of FIG. 3B;

FIG. 4 shows a $V_F$-$J_F$ (forward voltage drop-forward current) characteristic of rectifiers;

FIG. 5 shows a $V_R$-$J_R$ (reverse voltage-reverse leakage current) characteristic of rectifiers;

FIG. 9C is a cross sectional view showing a unit cell of still another rectifier according to the second embodiment of the invention;

FIG. 9D is a cross sectional view showing a unit cell of another rectifier according to the second embodiment of the invention;

DETAILED DESCRIPTION OF THE PREFERRED EMBODIMENTS

There will now be described embodiments of the present invention with reference to the accompanying drawings.

Figure 1:
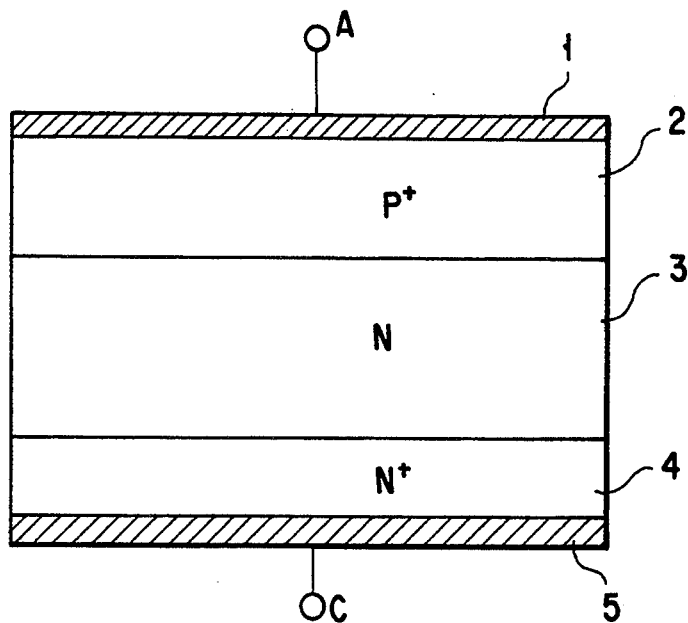
FIG. 1 is a cross sectional view showing a conventional rectifier.
Figure 2B:
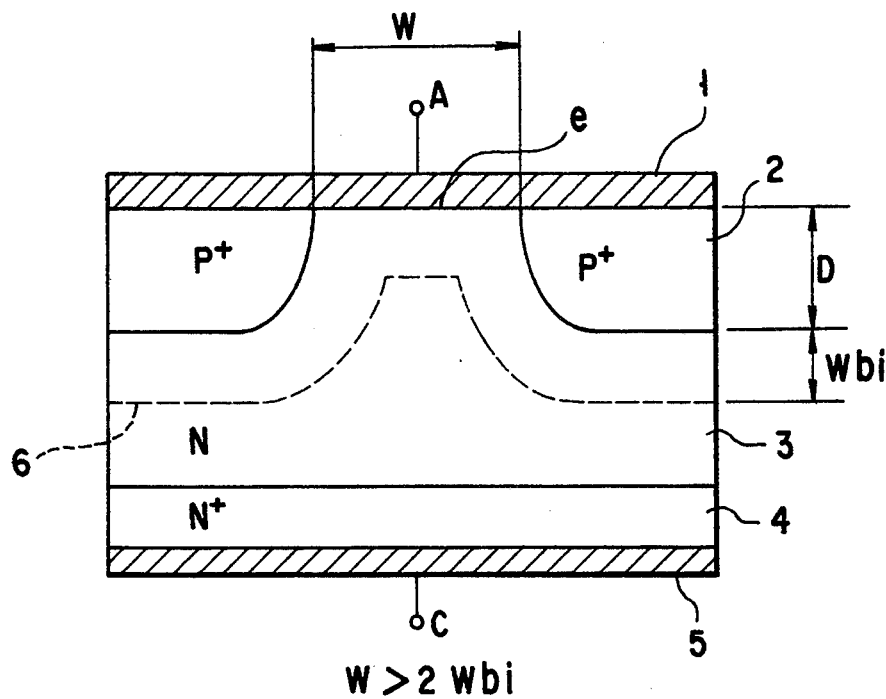
FIG. 2B is a cross sectional view showing a unit cell of a rectifier ($W > 2W_{bi}$) according to the first embodiment of the invention.

FIGS. 2A and 2B show a unit cell of a rectifier according to a first embodiment of the invention and FIG. 3 shows the rectifier having a plurality of unit cells. Portions which are the same as those of FIG. 1 are denoted by the same reference numerals.

In FIGS. 2A and 2B, the unit cell of the rectifier includes a semiconductor substrate having an N+-type semiconductor layer 4 and an N-type semiconductor layer 3. The N-type semiconductor layer 3 includes a P+-type semiconductor layer 2 having a depth D to provide a PN junction. A metal electrode 1 is provided on the substrate surface to form a contact surface e with the exposed surface of the N-type semiconductor layer 3. The depth D of the P+-type semiconductor layer 2 is given by a distance from the contact surface e. Further, the nearest distance between portions of the P+-type semiconductor layer 2 or portions of the PN junction, which are opposed to each other just under the contact surface e, that is, the N-type semiconductor layer 3 exposed to the substrate surface, is given by W. In this case, since the opposing portions of the P+-type semiconductor layer 2 are provided outside an area defined by the contact surface e, that is, they are not provided inside the area defined by the contact surface e, the nearest distance W can be substantially given by the width of the N-type semiconductor layer 3 exposed to the substrate surface. A metal electrode 5 is in ohmic contact with the N+-type semiconductor layer 4. As is apparent from FIG. 3A, the N-type semiconductor layer 3 exposed to the substrate surface is square in configuration having a width W (the nearest distance).

A built-in depletion layer 6 at a zero-bias voltage, that is, no voltage is applied between the anode A and the cathode C of the rectifier, extends to the N-type semiconductor layer 3 having a low impurity concentration, and the width thereof is given by Wbi.

FIG. 2A shows the structure such that a relation between the width W of the N-type semiconductor layer 3 exposed to the substrate surface and the width Wbi of the built-in depletion layer 6 is given by W<2Wbi, and FIG. 2B indicates the structure such that the above relation is rendered by W>2Wbi.

The important factor in the structures of FIGS. 2A and 2B is that the relation between the depth D of the P+-type semiconductor layer 2 and the nearest distance W is defined to satisfy D≧0.5W.

It is clear that since the depth D is given by the distance from the contact surface e, the depth is rendered by a distance between a projected contact surface e and a bottom of the P+-type semiconductor layer 2. For example, in the case where a portion of the contact surface e is projected upwardly from the surface of the P+-type semiconductor layer 2, and when portions of the P+-type semiconductor layer 2 opposed to each other or portions of PN junction are located inside the contact surface e, the nearest distance W is given by the nearest distance between the portions of the P+-type semiconductor layer 2 opposed to each other or between the portions of the PN junction.

Figure 3A:
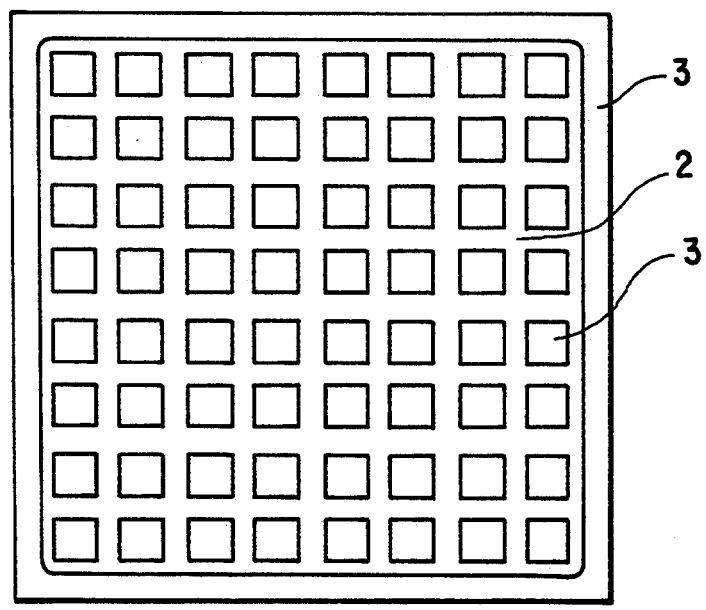
FIG. 3A is a plan view of the rectifier having a plurality of unit cells each having the same structure as the unit cell of FIG. 2A or 2B.

As shown in FIG. 3A, the N-type semiconductor layer 3 exposed to the substrate surface is square in configuration having the width W (the nearest distance). However, as shown in FIG. 3B, the N-type semiconductor layer 3 exposed to the substrate surface may be provided by a stripe-shaped structure having the width W (the nearest distance). FIG. 3C shows the cross section of the structure of FIG. 3B.

The rectifier shown in FIG. 2A may be formed as follows, for example.

A semiconductor substrate is prepared which includes an N+-type semiconductor layer 4 having a resistivity of 0.010 Ω-cm and an N-type semiconductor layer 3 grown on the semiconductor layer 4 by a epitaxial growth technique and having a resistivity of 5 Ω-cm and a thickness of 14 μm. Then, P-type impurity is selectively introduced into the N-type semiconductor layer 3 to provide a P+-type semiconductor layer 2 having a depth D of 3 μm. In this case, the P+-type semiconductor layer 2 having the depth D is provided such that the N-type semiconductor layer 3 exposed to the substrate surface is square in configuration having a width W (the nearest distance). A Ti electrode 1 is formed on the substrate surface to form a contact surface e in combination with the exposed surface of the N-type semiconductor layer 3. In this case, a Schottky barrier is formed between the metal electrode 1 and the N-type semiconductor layer 3, and an ohmic contact is provided between the metal electrode 1 and the P+-type semiconductor layer 2. Mo, W, Cr or Al may be used instead of Ti. After phosphorus is introduced into the N+-type semiconductor layer 4 to obtain an impurity concentration of $10^{21}$ atoms/cm$^3$, an ohmic metal electrode 5 of Cr is provided on the N+-type semiconductor layer 4. Thereafter, the semiconductor substrate is divided into chips of 1.6×1.6 mm to obtain rectifiers.

In the rectifier, the width Wbi of the built-in depletion layer 6 is given by 1.05 μm. The width Wbi of the depletion layer 6 may be changed in a range of 1 to 1.5 μm according to variation in the resistivity of the N-type semiconductor layer 3 caused in the manufacturing process or the forming condition of the P+-type semiconductor layer 2 or the like.

In the first embodiment, a Schottky barrier is formed between the N-type semiconductor layer 3 and the metal electrode 1, and an ohmic contact is formed between the P+-type semiconductor layer 2 and the metal electrode 1. However, it may be possible to provide the Schottky barrier between 3 and 1 and between 2 and 1, to form the ohmic contact between 3 and 1 and between 2 and 1, or to provide the ohmic contact between 3 and 1 and the Schottky barrier between 2 and 1 by changing the impurity concentration of the P+-type semiconductor layer 2 or the N-type semiconductor layer 3.

FIG. 4 is the $V_F$-$J_F$ characteristic showing the forward characteristics of rectifiers having various combinations of the Schottky barrier and ohmic contact, and FIG. 5 is the $V_R$-$J_R$ characteristic showing the reverse characteristics of the rectifiers.

In FIGS. 4 and 5, the forward and reverse characteristics of the rectifiers according to the invention are indicated by curves (c), (d), (e) and (f).

The curves (c) to (f) show the combinations of junctions or contacts between the metal electrode 1 and the N-type semiconductor layer 3 or P+-type semiconductor layer 2 as follows.

Curve (c): the ohmic contact between 3 and 1, and the ohmic contact between 2 and 1.

Curve (d): the ohmic contact between 3 and 1, and the Schottky barrier between 2 and 1.

Curve (e): the Schottky barrier between 3 and 1, and the ohmic contact between 2 and 1.

Curve (f): the Schottky barrier between 3 and 1, and the Schottky barrier between 2 and 1.

As described before, the curve (a) indicates the characteristic of the rectifier having the PN junction and the curve (b) indicates the characteristic of the rectifier having the Schottky barrier.

As is apparent from the above characteristics, the rectifiers with structures of (c), (d), (e) and (f) have the value of $V_F$, which is given by a value between the curve (b) of the conventional Schottky barrier type rectifier and the curve (a) of the PN junction type rectifier, in a low $J_F$ region of the forward characteristic, and also have the similar reverse characteristic to the curve (a) of the PN junction rectifier.

Figure 6:
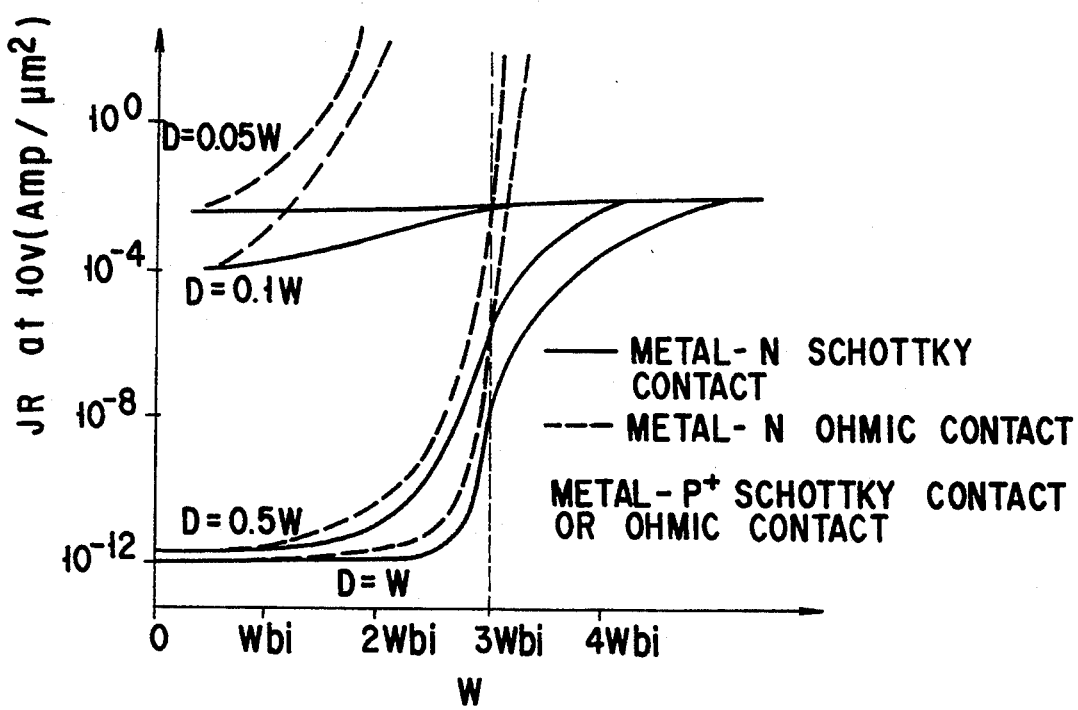
FIG. 6 shows a W-$J_R$ (the nearest distance-reverse leakage current) characteristic of rectifiers.
Figure 7:
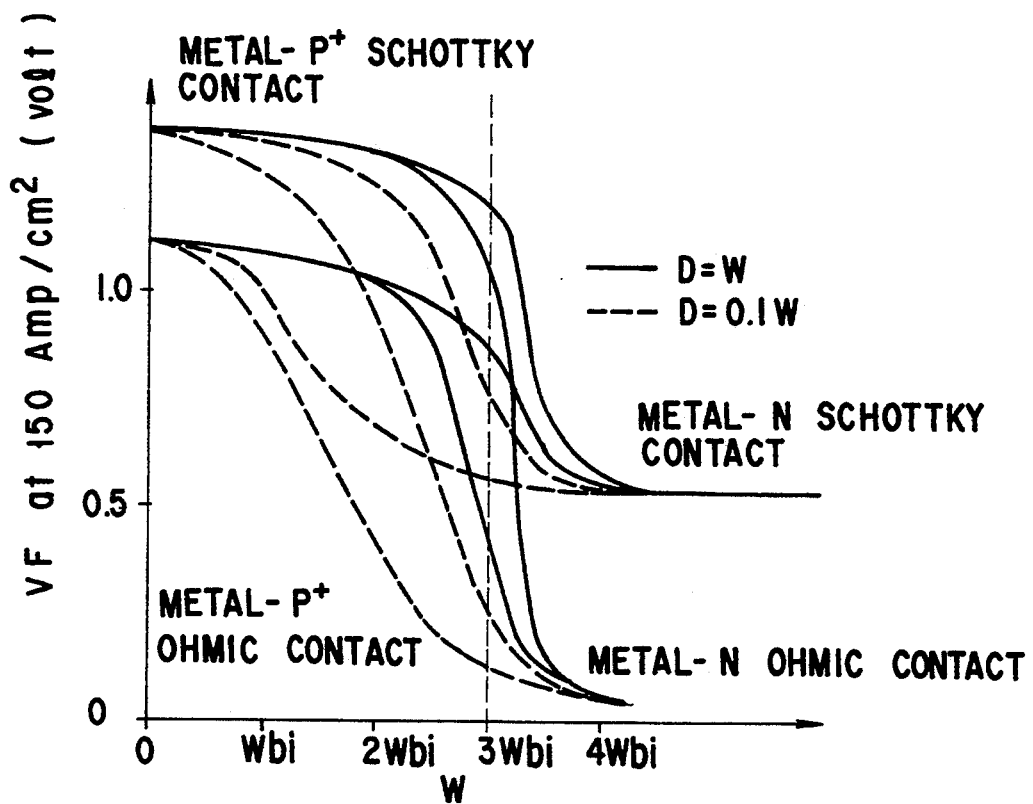
FIG. 7 shows a W-$V_F$ (the nearest distance-forward voltage drop) characteristic of rectifiers.

FIGS. 6 and 7 indicate the relation between the width W (the nearest distance) of the N-type semiconductor layer 3 exposed to the substrate surface and the width Wbi of the built-in depletion layer.

That is, FIG. 6 shows a W-$J_R$ (the nearest distance-reverse leakage current) characteristic, and FIG. 7 shows a W-$V_F$ (the nearest distance-forward voltage drop) characteristic. FIGS. 6 and 7 also show curves indicating the relation between D and W in the case where D=0.1W and D=0.05W which are out of the technical scope of the invention.

It is understood that the reverse leakage current $J_R$ of the rectifier with the structure of D=0.05W or D=0.1W which is out of the technical scope of the invention becomes significantly large in the W-$J_R$ characteristic of FIG. 6. It is clear that the reverse leakage current $J_R$ becomes significantly small when the condition is given by D≧0.5W in a range of W<3Wbi.

Figure 8:
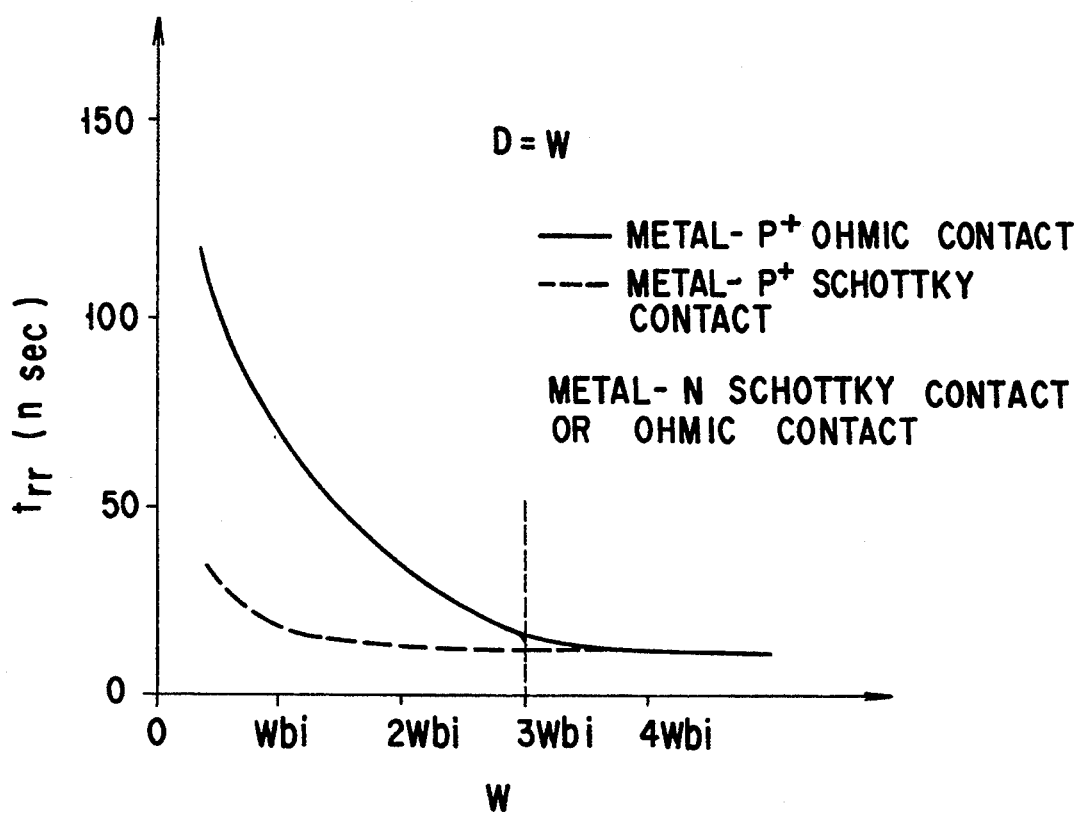
FIG. 8 shows a W-trr (the nearest distance-reverse recovery time) characteristic of rectifiers.

FIG. 8 shows a W-trr (the nearest distance-reverse recovery time) characteristic in the case of D=W according to the invention.

The solid line indicates that the ohmic contact is provided between 2 and 1. In this case, trr is slightly increased as compared with the rectifier having the single Schottky barrier, but it is substantially equivalent.

In FIG. 8, the broken line indicates that the Schottky barrier is provided between 2 and 1. In this case, a characteristic having extremely short trr can be obtained. That is, when a forward bias voltage is applied between the anode A and the cathode C, the Schottky barrier between 2 and 1 is reverse-biased, whereby the forward bias voltage is not substantially applied across the P+N junction. Therefore, the holes will not be almost injected into the N-type semiconductor layer 3 from the P+-type semiconductor layer 2. As a result, although the forward characteristic has a high series resistance characteristic as shown by the curve (d) or (f) of FIG. 4, the high-speed switching characteristic as indicated by the broken line in FIG. 8 can be obtained.

As described above, it will be apparent that even if the structures of the rectifier satisfy the important factor given by D≧0.5W, they are affected by the relation between W and Wbi as shown in FIGS. 6, 7 and 8.

That is, the rectifier of this invention exhibits further improved characteristics by satisfying the condition given by W≦3Wbi or W≧Wbi.

Next, a rectifier according to a second embodiment of the invention will be described.

FIGS. 9A to 9D show unit cells of the rectifier in the same manner as the first embodiment, and the plan views thereof are the same as FIGS. 3A to 3C.

In the embodiment, an angle $\theta$ is defined by 60°≦$\theta$≦120° in addition to D≧0.5W, where the angle $\theta$ is an angle between the contact surface e or the surface of the N-type semiconductor layer 3 and a tangent line s passing through a point f on the PN junction. In this case, the point f on the PN junction is given by an intersection between the PN junction and a straight line g passing through a top of the built-in depletion layer 6 and extending in parallel with the contact surface e or the exposed surface of the N-type semiconductor layer 3.

Figure 9A:
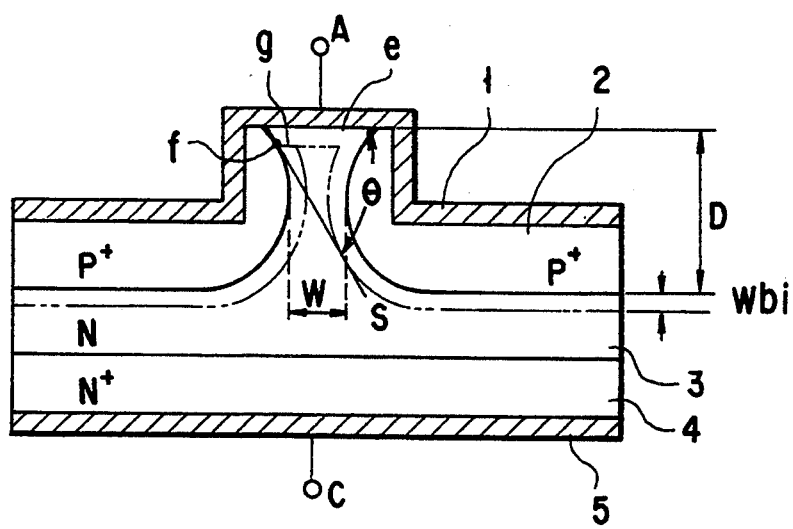
FIG. 9A is a cross sectional view showing a unit cell of a rectifier according to a second embodiment of the invention.

FIG. 9A shows a unit cell of a rectifier having a structure such that the contact surface e between the N-type semiconductor layer 3 and the metal electrode 1 is projected upwardly from the contact surface between the P+-type semiconductor layer 2 and the metal electrode 1, and the angle $\theta$ between the contact surface e and the tangent line s passing through the point f on the PN junction is an acute angle, for example, 60°. The range of the angle $\theta$ is given by 60°≦$\theta$<90°. In this case unlike the first embodiment shown in FIGS. 2A and 2B, since the opposing portions of the P+-type semiconductor layer 2 are provided inside the contact surface e, the nearest distance W is given by a distance between the opposing portions of the PN junction or the opposing portions of the P+-type semiconductor layer 2. Further, since the depth D of the P+-type semiconductor layer 2 is given by a depth from the contact surface e, the depth D is rendered by a distance between the projected contact surface e and the bottom of the P+-type semiconductor layer 2.

Figure 9B:
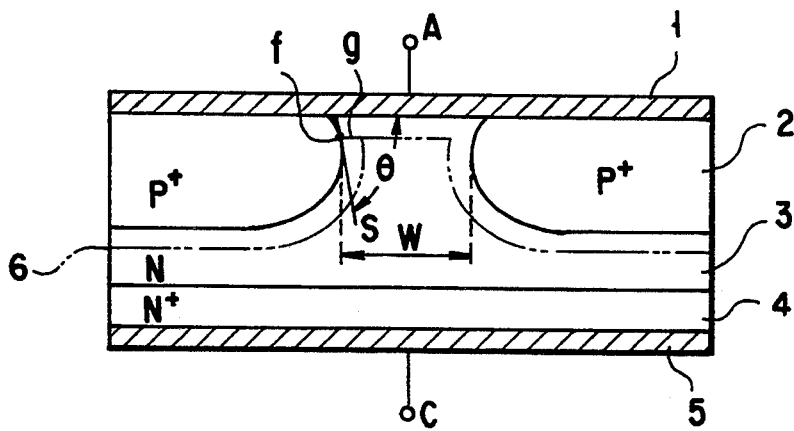
FIG. 9B is a cross sectional view showing a unit cell of another rectifier according to the second embodiment of the invention.

FIGS. 9B, 9C and 9D each show the unit cell of the rectifier in which the angle $\theta$ is changed in a range of 60°≦$\theta$≦120°. That is, the angle $\theta$ is gradually increased, and in the case of FIG. 9D, the angle $\theta$ is given by 120°. In this case, the depth D of the P+-type semiconductor layer 2 is a depth from the contact surface e, but the nearest distance W is substantially given by the width of the N-type semiconductor layer 3 which is exposed to the substrate surface.

Further, the rectifier of the second embodiment is made in the same manner as the that of the first embodiment. The $V_F$-$J_F$ forward characteristic and the $V_R$-$J_R$ reverse characteristic of the rectifier are similar to those shown in FIGS. 4 and 5 in the first embodiment.

Figure 10:
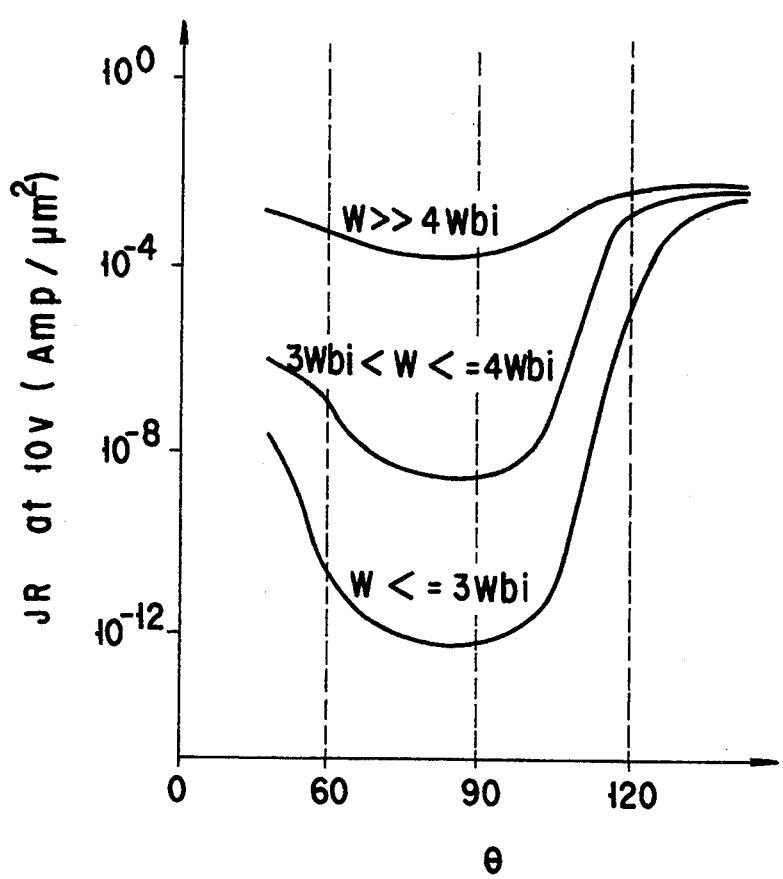
FIG. 10 shows a $\theta$-$J_R$ (angle-reverse leakage current) characteristic of rectifiers.

FIG. 10 is a $\theta$-$J_R$ (angle-reverse leakage current) characteristic.

As is apparent from FIG. 10, in order to obtain the characteristic curves (c), (d), (e) and (f) shown in FIG. 5, the angle $\theta$ must be provided in the range of 60°≦$\theta$≦120°. That is, in the case where $\theta$ is smaller than 60° or larger than 120°, the reverse leakage current $J_R$ is increased even if the condition of D≧0.5W is satisfied. Therefore, the objects of the present invention cannot be achieved. FIG. 10 shows curves obtained when the Schottky barrier is provided between 3 and 1, and the Schottky barrier junction or ohmic contact is formed between 2 and 1 at D=W, respectively. Samples having different values of $\theta$ were formed by the manufacturing process utilizing a combination of the thermal diffusion using a boron source, the lapping from the surface and the ion-implantation technique.

As shown in FIG. 10, the characteristic is shown using the relation between the nearest distance W and the width Wbi of the built-in depletion layer as a parameter.

Figure 11:
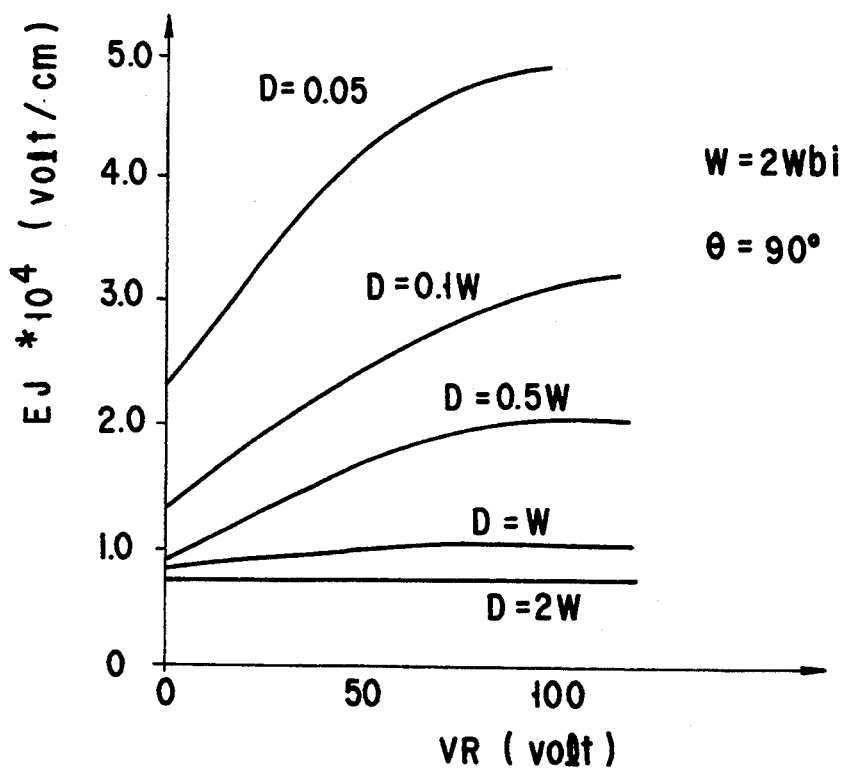
FIG. 11 shows a $V_R$-$E_J$ (reverse voltage-electric field strength) characteristic of rectifiers.

FIG. 11 shows a $V_R$-$E_J$ (reverse voltage-electric field strength) characteristic. $E_J$ denotes the strength of the electric field across the contact surface e between 3 and 1.

As is clearly understood from FIG. 11, the electric field strength $E_J$ is saturated at a small value in the range of $D \geq 0.5W$ described above. It is also clear from the generally known theoretical equation that the reverse leakage current $J_R$ becomes a small value which do not have a voltage dependence when $E_J$ is saturated at a small value. In the case of $D=0.05W$ or $D=0.1W$ which is out of the above condition, $E_J$ becomes a large value having the voltage dependency.

The characteristic for the reverse recovery time trr is the same as the W-trr (the nearest distance-reverse recovery time) characteristic of FIG. 8 in the first embodiment.

As described above, it is understood that the above characteristics are affected by the relation between W and Wbi as explained with reference to FIGS. 8 and 10 even if the two conditions, $60° \leq \theta \leq 120°$ and $D \geq 0.5W$, are satisfied in the second embodiment.

That is, the semiconductor rectifier of the invention provides further improved characteristics by satisfying the condition of $W \leq 3Wbi$ or $W \geq Wbi$.

As described above, the inventors have found that even if the metal electrode 1 is in ohmic contact with the P+-type semiconductor layer 2 to inject the minority carrier to the N-type semiconductor layer 3, a remarkably unusual or unique phenomenon occurs in the reverse recovery characteristic in spite of the fact that the contact between the metal electrode 1 and the N-type semiconductor layer 3 is provided by the Schottky barrier or the ohmic contact when $D \geq 0.5W$, $W_{bi} \leq W \leq 3Wbi$ and $60° \leq \theta \leq 120°$ are satisfied in the semiconductor rectifier.

That is, the minority carrier (hole) excessively injected into the N-type semiconductor layer 3 flows through the P+-type semiconductor layer 2 toward the metal electrode 1 for a very short time given by initial several nanosecond when the rectifier is reverse-biased. At the same time, the majority carrier (electron) of the N-type semiconductor layer 3 flows through the metal electrode 1 in equal amounts, opposing to the direction of the electric field. Therefore, the holes and electrons are recombined within the metal electrode 1 to disappear. In this case, the flow of these carriers for the very short time is not observed between external electrodes. Thereafter, the remained minority carrier disappear naturally within the N-type semiconductor layer 3 disposed under the P+-type semiconductor layer 2. Accordingly, a semiconductor rectifier having an excellent $t_{rr}$ characteristic will be provided.

According to the present invention, semiconductor rectifiers having high breakdown voltage and high-speed operation can be provided and can be widely applied to various industrial apparatus, such as power apparatus, etc., thereby increasing their practical uses.

It is further understood by those skilled in the art that the foregoing description is only of the preferred embodiments and that various changes and modifications may be made in the invention without departing from the spirit and scope thereof.

What is claimed is:

1. A semiconductor rectifier comprising:
    a first semiconductor layer of a first conductivity type having a main surface;
    a second semiconductor layer of a second conductivity type formed in said first semiconductor layer to define a plurality of portions of said first semiconductor layer exposed to said main surface, each of said plurality of portions of said first semiconductor layer being surrounded by opposed portions of said second semiconductor layer and forming a p-n junction with each of said opposed portions of said second semiconductor layer below said main surface;
    a metal electrode provided over a surface of said second semiconductor layer including said plurality of portions of said first semiconductor layer, said metal electrode forming a contact surface with each of said plurality of portions of said first semiconductor layer; and
    a relation between a depth D and a width W being given by $D > 0.5W$ where said depth D is a distance between said contact surface and a bottom of said second semiconductor layer, and said width W being a shortest distance between said opposed portions of said second semiconductor layer below said contact surface.

2. The semiconductor rectifier according to claim 1, wherein said metal electrode is in ohmic contact with both said plurality of portions of said first semiconductor layer and said second semiconductor layer.

3. The semiconductor rectifier according to claim 1, wherein said metal electrode is in ohmic contact with said plurality of portions of said first semiconductor layer, and said metal electrode forms a Schottky barrier contact with said second semiconductor layer.

4. The semiconductor rectifier according to claim 1, wherein said metal electrode is in Schottky barrier contact with said plurality of portions of said first semiconductor layer, and is in ohmic contact with said second semiconductor layer.

5. The semiconductor rectifier according to claim 1, wherein said metal electrode is in Schottky barrier contact with both said plurality of portions of said first semiconductor layer and said second semiconductor layer.

6. The semiconductor rectifier according to claim 1, wherein a depletion layer extends to said plurality of portions of said first semiconductor layer.

7. The semiconductor rectifier according to claim 1, wherein said width W is given by $W_{bi} < W < 3W_{bi}$, where $W_{bi}$ is a thickness of a built-in depletion layer extending to said first semiconductor layer at zero bias voltage.

8. The semiconductor rectifier according to claim 1, wherein each of said plurality of portions of said first semiconductor layer is square.

9. The semiconductor rectifier according to claim 1, wherein each of said plurality of portions of said first semiconductor layer has a stripe-shaped structure.

10. The semiconductor rectifier according to claim 1, wherein an angle $\theta$ is defined as an angle between said contact surface and a tangent line passing through a point f on said p-n junction, said point f being at an intersection of said p-n junction and a straight line passing through a top of a built-in depletion layer and extending in parallel with said contact surface, said angle $\theta$ being $60° < \theta < 120°$.

11. The semiconductor rectifier according to claim 1, wherein said width W is a width of each of said plurality of portions of said first semiconductor layer.

12. A semiconductor rectifier comprising:
a first semiconductor layer of a first conductivity type;
a plurality of grooves formed in said first semiconductor layer to provide projected portions;
a second semiconductor layer of a second conductivity type formed in said first semiconductor layer, except for an exposed surface of each of said projected portions, to define opposed portions of said second semiconductor layer on opposing sides of each of said projected portions, each of said opposed portions of said second semiconductor layer forming a p-n junction with said first semiconductor layer, wherein a depth D of said second semiconductor layer is a distance between said exposed surface of each of said projected portions and a bottom of said p-n junction, and a distance W is a shortest distance between said opposed portions of said second semiconductor layer below said exposed surface of each of said projected portions;
a relation between said depth D and said distance W being given by $D > 0.5W$;
an angle $\theta$ being given by $60° < \theta < 90°$, where said angle $\theta$ is an angle between said exposed surface of each of said projected portions and a tangent line passing through a point f on said p-n junction, said point f being at an intersection of said p-n junction and a straight line passing through a top of a built-in depletion layer and extending in parallel with said exposed surface of each of said projected portions; and
a metal electrode provided over a surface of said second semiconductor layer including said exposed surface of said projected portions.

13. The semiconductor rectifier according to claim 12, wherein each of said projected portions includes upper corners, and said p-n junction intersects said upper corners of each of said projected portions.

14. The semiconductor rectifier according to claim 12, wherein said p-n junction extends to each of said projected portions to define said shortest distance W between said opposed portions of said second semiconductor layer.

15. The semiconductor rectifier according to claim 12, wherein said metal electrode is in ohmic contact with both said projected portions of said first semiconductor layer and said second semiconductor layer.

16. The semiconductor rectifier according to claim 12, wherein said metal electrode is in ohmic contact with said projected portions of said first semiconductor layer and forms a Schottky barrier contact with said second semiconductor layer.

17. The semiconductor rectifier according to claim 12, wherein said metal electrode is in Schottky barrier contact with said projected portions of said first semiconductor layer, while being in ohmic contact with said second semiconductor layer.

18. The semiconductor rectifier according to claim 12, wherein said metal electrode is in Schottky barrier contact with both said projected portions of said first semiconductor layer and said second semiconductor layer.

19. The semiconductor rectifier according to claim 12, wherein said distance W is given by $W_{bi} < W < 3W_{bi}$, where $W_{bi}$ is a thickness of said built-in depletion layer extending in said first semiconductor layer.

* * * * *